United States Patent [19]

Kobayashi et al.

[11] Patent Number: 4,611,686

[45] Date of Patent: Sep. 16, 1986

[54] SPEAKER SYSTEM

[75] Inventors: Yoshiaki Kobayashi; Hiroshi Yoshida, both of Tokyo, Japan

[73] Assignee: Clarion Co., Ltd., Tokyo, Japan

[21] Appl. No.: 747,151

[22] Filed: Jun. 20, 1985

[30] Foreign Application Priority Data

Jun. 25, 1984 [JP] Japan ............................... 59-129240

[51] Int. Cl.$^4$ ............................................... H05K 5/00

[52] U.S. Cl. ..................................... 181/156; 181/199

[58] Field of Search ......................... 181/155, 156, 199

[56] References Cited

U.S. PATENT DOCUMENTS 2,205,804 6/1940 Wells .................................. 181/155

3,952,159 4/1976 Schott ............................ 181/156 X 4,135,600 1/1979 Ogi et al. ............................ 181/156

4,413,703 11/1983 Kato et al. .......................... 181/156

*Primary Examiner*—Benjamin R. Fuller

*Attorney, Agent, or Firm*—Flynn, Thiel, Boutell & Tanis

[57] ABSTRACT

A speaker system includes an enclosure having a port from which a duct extends into the interior of the enclosure. A board having a smaller area than the cross-sectional area of at least the exit of the duct is mounted to block the port except a slight slit defined by the entire circumferential edge of the board and the opposed inner wall of the duct, so that the slight slit serves as a pressure duct whereas the remainder of the duct serves as a guide duct.

7 Claims, 13 Drawing Figures

SPEAKER SYSTEM

FIELD OF THE INVENTION

This invention relates to a speaker system, and more particularly to an improvement in the low frequency characteristics of a speaker system with a small-scaled enclosure.

BACKGROUND OF THE INVENTION

Most of small-scaled speaker systems have an enclosure of closed box type or bass-reflex type. A prior art base-reflex type speaker system is shown in FIGS. 1 through 4 where an enclosure comprises a case 1 and a front baffle 2. The front baffle 2 supports a woofer $SP_1$ and a tweeter $SP_2$, and has a port from which a duct cylinder 3 defining a duct extends into the interior of the enclosure 1. Reference numeral 4 denotes a protector made of rubber or other equivalent material to protect a rear glass member. Since the enclosure is small-scaled to meet an expected limited amount space, the duct cylinder 3 also has a limited dimension. Therefore, the prior art speaker system involves the following problems. Namely, due to the limited dimension of the enclosure, it is not prevented that some intermediate frequency waves radiated rearward from the woofer $SP_1$ come out of the interior to the exterior of the enclosure through the duct 3. These waves join the intermediate frequency waves radiated directly frontward by the woofer $SP_1$ and deteriorate the sound quality. Further, the limited dimension of the duct 3 unables a decrease of synchronous frequencies and a sufficient reproduction in low frequencies.

OBJECT OF THE INVENTION

It is therefore an object of the invention to provide an improved speaker system which significantly reduces IF wave leakage through the duct and thereby prevents a deterioration of the reproduced sound caused by an influence of the leaked waves against the intermediate or low frequency waves radiated directly frontward.

A further object of the invention is to provide a speaker system which is excellent in low frequency reproduction.

SUMMARY OF THE INVENTION

In accordance with the invention, there is provided a speaker system where a low frequency reinforcing duct is provided within the enclosure of the speaker system to communicate the interior of the enclosure to the exterior through a port. The port is blocked by a board with a smaller area except a slit which is significantly smaller than the cross sectional area of the duct and has a substantially uniform width between the circumferential edge of the board and the opposed inner wall of the duct.

Most part of the duct (guide duct) may be in the same form and size as that in the prior art, but the exit portion adjacent the port is enlarged and receives the board therein. The board secured by legs to a step which is the border between the enlarged exit and the remainder of the duct. Thus a pressure duct which is a slight slit with a substantially uniform width is defined by the circumferencial edge of the board and the inner wall of the enlarged exit of the duct, and this communicates the interior of the enclosure to the exterior of the speaker system.

The invention will be better understood from the description given below, referring to some preferred embodiments illustrated.

BRIEF DESCRIPTION OF THE DRAWINGS

FIGS. 1 through 4 illustrate a prior art bass-reflex speaker system wherein FIG. 1 is a front elevation, FIG. 2 is a side elevation with a cross-sectioned portion, and FIG. 3 is a top view with a cross-sectioned portion, and FIG. 4 is a view corresponding to but more simplified than FIG. 3 to show movements of rearward radiated waves;

FIGS. 5 through 7 illustrate an embodiment of the invention wherein FIG. 5 is a front elevation, FIG. 6 is a side elevation with a cross-sectioned portion, and FIG. 7 is a top view with a cross-sectioned portion;

FIGS. 8 through 10 illustrate a further embodiment of the invention wherein FIG. 8 is a front elevation, FIG. 9 is a side elevation with a cross-sectioned portion, and FIG. 10 is a top view; and FIGS. 11 through 13 illustrate a still further embodiment of the invention wherein FIG. 11 is a top view, FIG. 12 is a side elevation with a cross-sectioned portion, and FIG. 13 is a view taken from an upper and rear position.

DETAILED DESCRIPTION

Figure 5:
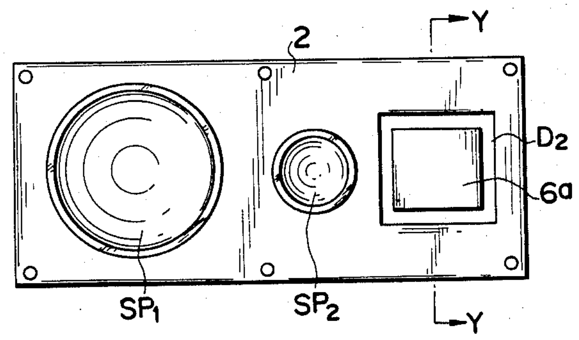
Figure 6:
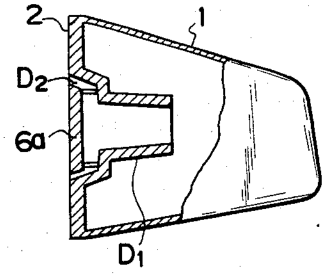
Figure 7:
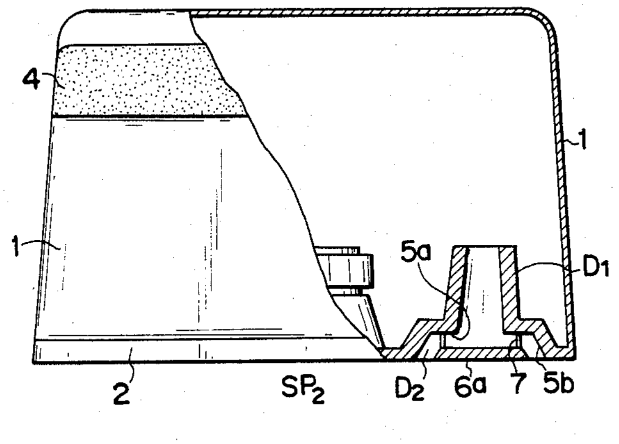

Referring to FIGS. 5 through 7 illustrating the first embodiment of the invention, a bass-reflex enclosure has the same configuration as that in the prior art speaker system. The front baffle 2 carries a woofer $SP_1$ and a tweeter $SP_2$. The front baffle 2 has a square port from which a duct extends into the interior of the case 1. The duct includes an enlarged exit adjacent the port and a guide duct $D_1$ apart from the port and having a smaller cross-sectional area than the exit and the port. The enlarged exit and the guide duct $D_1$ are integrally united by a step 5*a* which is parallel to and spaced from the front baffle 2. A plastic board 6*a* having a smaller area than the cross-sectional area of the enlarged exit of the duct is mounted in the center of the exit so as to block the port except a slight slit with a uniform width all around the circumferential edge of the board 6*a*. The front face of the board 6*a* is coplanar with the front face of the front baffle 2, and the rear face of the board 6*a* is spaced from and connected by some plastic legs to the step 5*a*. Thus the interior of the guide duct $D_1$ communicates the exterior of the enclosure only through a narrow slit defined by the circumferential edge and inner surface of the board 6*a*, the opposed inner wall of the enlarged exit of the duct and the step 5*a*. The slight slit is referred to as a pressure duct $D_2$ in this text. The position of the step 5*a* is selected so as to provide an adequate radiating path length which produces the best radiated sound pressing effects.

Figure 8:
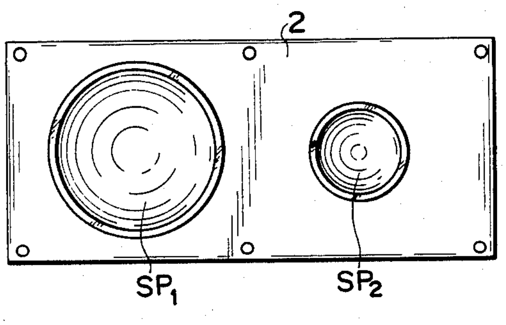
Figure 9:
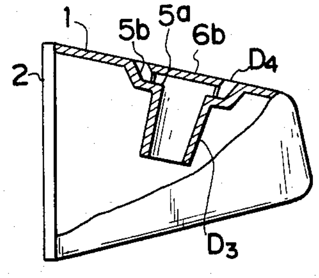
Figure 10:
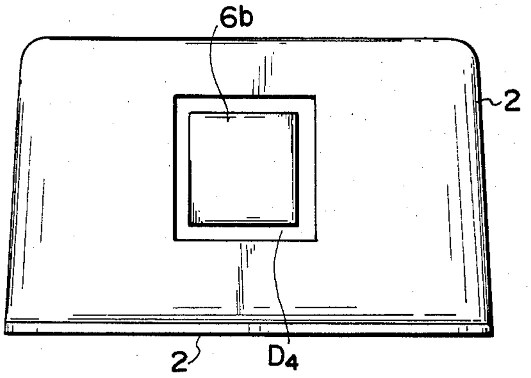

FIGS. 8 through 10 illustrate the second embodiment of the invention where the guide duct $D_3$ and the pressure duct $D_4$ are provided at an upper wall portion of the case 1 instead of the front baffle 2.

Figure 1:
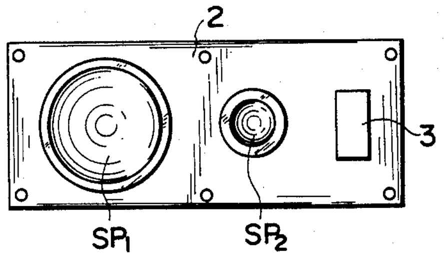
FIG. 1 (PRIOR ART)
Figure 2:
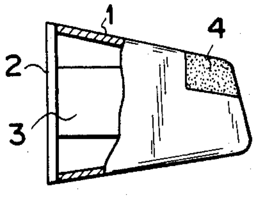
FIG. 2 (PRIOR ART)
Figure 3:
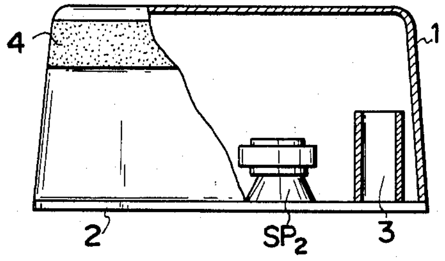
FIG. 3 (PRIOR ART)
Figure 4:
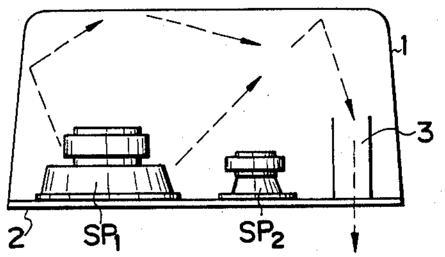
FIG. 4 (PRIOR ART)
Figure 11:
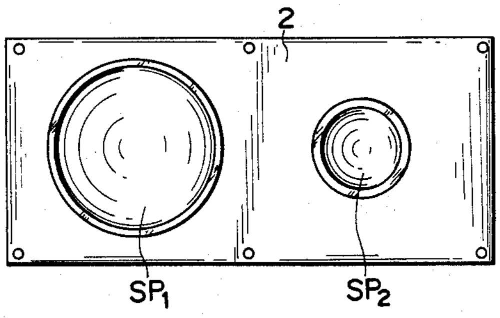
Figure 12:
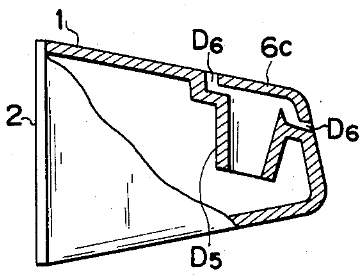
Figure 13:
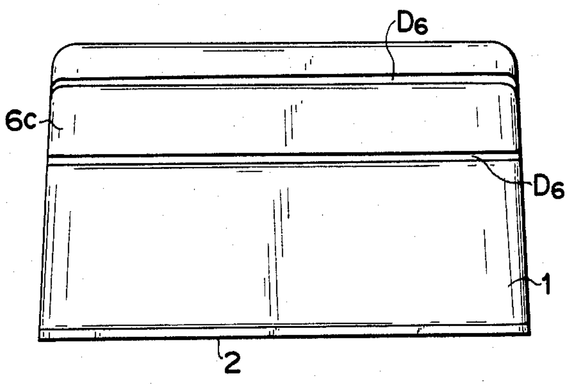

FIGS. 11 through 13 illustrate the third embodiment of the invention where the guide duct $D_5$ and the pressure duct $D_6$ are provided at a portion of the case 1 corresponding to the position of the protector 4 shown in FIG. 3. The board 6*c* is laterally elongated.

With the described arrangements of the invention wherein the cross sectional area of the pressure duct $D_2$, $D_4$ or $D_6$ is significantly smaller than that of the guide duct $D_1$, $D_3$ or $D_5$, waves radiated rearward and reflected back to the guide duct are suppressed when passing through the pressure duct. As the result, with an interaction between an inherent function of the guide duct to reinforce low frequency waves and the suppressing function of the pressure duct, externally radiated frequencies are limited as compared to the prior construction with a simple guide duct, thereby effecting a greater attenuation of intermediate frequencies and providing a reproduced sound with an increased low frequency radiating characteristic and a decreased distortion. Further, since the pressure duct has a substantially uniform width throughout the circumference of the board *6a*, low frequency waves radiated therethrough never produce a phase difference.

As described above, since the invention speaker system prevents that intermediate frequency waves radiated rearward from the woofer, etc. come out of the interior to the exterior of the enclosure through the duct, the reproduced sound merely has a significantly reduced distortion which is otherwise caused by the duct-through intermediate frequency waves mixed up with the waves radiated directly frontward from the woofer or the like. Additionally, since low frequency waves radiated through the pressure duct never produce a phase difference, an improved and effective reproduction is established in low frequency bands. The port blocked by the board except the small pressure duct rejects foreign matters.

The first embodiment where the board is positioned in the front baffle assists an improved design of the speaker system by hot-stamping or printing different figures or drawings.

The second and third embodiments where the pressure duct is opened upward and not frontward give the substantially same effects as those of the first embodiment as far as the speaker system is used in a limited sound space such as a car room.

The board may be shaped in a disc instead the illustrated square or rectangular.

The embodiments of the invention in which an exclusive property or privilege is claimed are defined as follows:

1. A speaker system, comprising:

an enclosure having therein at least one speaker;

a duct which is provided within said enclosure, communicates with the interior of said enclosure, and communicates with the exterior of said enclosure through a port provided in a wall of said enclosure; and a flat, platelike board having a size smaller than the size of said port and positioned in the center of said port so as to extend approximately parallel to an exterior surface portion of said wall in the region of said port, said board cooperating with an inner wall of said duct adjacent said port to define a narrow, circumferential slit which has a uniform width along the entire circumference of said board and which has a smaller total cross-sectional size than the cross-sectional size of said duct in the region of said port;

wherein said port is provided in a front baffle which defines a front limit of said enclosure.

2. A speaker system, comprising:

an enclosure having at least one speaker therein and having a duct which extends into said enclosure from a port provided in an exterior surface of a wall of said enclosure, said duct having a first portion which is adjacent said port and having a second portion which is spaced from said port and has a cross-sectional size smaller than the cross-sectional size of said first portion, said first and second portions of said duct being connected by an outwardly facing annular step which has a substantially uniform width at all locations therealong; and a board which is disposed in and extends across said first portion of said duct, which has a peripheral edge surface which is spaced substantially a uniform distance from an inner surface of said first portion of said duct at all locations around said board and which has a rear surface which faces and has its peripheral edges spaced from said annular step, said uniform distance being less than said width of said step.

3. The speaker system according to claim 2, wherein said board has an outwardly facing side surface which is substantially flush with said exterior surface of said wall of said enclosure.

4. The speaker system according to claim 2, wherein said inwardly facing surface of said first portion of said duct converges gradually in a direction away from said port; wherein an inwardly facing surface of said second portion of said duct also converges gradually in a direction away from said port; and wherein said peripheral edge surface of said board converges gradually in a direction away from said port.

5. The speaker system according to claim 4, including a plurality of legs which extend between and are substantially perpendicular to adjacent portions of said rear surface of said board and said annular step, said legs supporting said board in said duct.

6. The speaker system according to claim 5, wherein said board is flat and substantially rectangular, and wherein said duct has a substantially rectangular cross-sectional shape.

7. The speaker system according to claim 3, wherein said wall of said enclosure has a curved portion in the region of said port, and wherein said board has a curvature corresponding to the curvature of said wall.

* * * * *